United States Patent
Kanehira et al.

(10) Patent No.: US 6,691,271 B1
(45) Date of Patent: Feb. 10, 2004

(54) BUILT-IN SELF-TEST APPARATUS

(75) Inventors: Yusuke Kanehira, Tokyo (JP);
Toshinori Inoshita, Tokyo (JP); Yoshio Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 507 days.

(21) Appl. No.: 09/590,188

(22) Filed: Jun. 9, 2000

(30) Foreign Application Priority Data

Jun. 10, 1999 (JP) .......................................... 11-163634

(51) Int. Cl.$^7$ ........................... G01R 31/28; G06F 11/00
(52) U.S. Cl. ........................................ 714/736; 714/735
(58) Field of Search .................................. 714/735, 736

(56) References Cited

U.S. PATENT DOCUMENTS

| | | | | |
|---|---|---|---|---|
| 5,170,398 A | * | 12/1992 | Fujieda et al. | 714/742 |
| 5,173,906 A | * | 12/1992 | Dreibelbis et al. | 714/733 |
| 5,471,484 A | * | 11/1995 | Kawasaki | 714/736 |
| 5,619,512 A | * | 4/1997 | Kawashima et al. | 714/733 |
| 5,668,819 A | * | 9/1997 | Fukushima | 714/736 |
| 5,930,271 A | * | 7/1999 | Takahashi | 714/738 |
| 6,097,206 A | * | 8/2000 | Takano | 324/765 |
| 6,119,257 A | * | 9/2000 | Negishi | 714/738 |

FOREIGN PATENT DOCUMENTS

| | | | | |
|---|---|---|---|---|
| JP | 62-206642 | | 9/1987 | |
| JP | 07198784 A | * | 8/1995 | G01R/31/28 |

* cited by examiner

Primary Examiner—Albert Decady
Assistant Examiner—Joseph D. Torres
(74) Attorney, Agent, or Firm—Leydig, Voit & Mayer, Ltd.

(57) ABSTRACT

A built-in self-test circuit including a signal generator and operational elements. The operational elements perform arithmetic operations on a test signal value A, generated by the signal generator, to obtain a comparison signal value A which is fundamentally equal to the test signal value A of the signal generator. By comparing the test signal value A with the comparison signal value A, a test result is obtained.

13 Claims, 12 Drawing Sheets

BUILT-IN SELF-TEST APPARATUS

FIELD OF THE INVENTION

The present invention relates to a test circuit to be built in an electronic circuit formed on a semiconductor device, and a testing method using the circuit.

BACKGROUND OF THE INVENTION

When there is no defect in a manufactured LSI, it is not necessary to carry out a manufacturing test (hereinbelow, simply called a test). In practice, however, some LSIs are defective due to factors such as dusts during the manufacture.

It is known that, when the cost of finding a defective LSI at a LSI level is taken to be 1, the cost at a board level is 10, that at a system level is 100, and that at a field level is 1000.

From the facts, it can be said that design for testability considering tests from an initial stage of design (stage of LSI) is important.

It is, however, hard to carry out a test on a sequential circuit since observation of the inside from the outside is difficult.

One of the conventional general methods satisfying the requirement of the test is a method of forming a BIST (Built In Self Test) circuit by scanning flip-flops (simply referred to FFs hereinbelow) existing in a sequential circuit and connecting a pattern generator and an expectation value comparator to the scanned circuit.

The scanning of the FF is to change the FF in the sequential circuit to a scanned FF. Specifically, a scan tune is obtained by an external input pin (scan mode: SM). When a clock is added to a clock of an external input (scan clock: T), the FF can be freely set to the FF for writing arbitrary data from the external input pin (scan in: SI). In the case of a structure capable of monitoring an output of each FF from the external output pin (scan out: SO), that is, by replacing the FF with a scanned FF, observability and controllability are increased to enable a test to be carried out.

An example of a full scan will be shown concretely. A circuit as shown in FIG. 12 is changed to have the construction as shown in FIG. 13 to realize a full scan.

A circuit having the construction of FIG. 14 is formed by providing the scan circuit with a pattern generator and an output value compressor. A test is carried out by outputting compressed, values for all patterns from the pattern generator and monitoring whether the internal state changes according to the expectation value by comparing the compressed value and a prepared expectation value with a tester.

With respect to the scanning of a circuit, when a normal FF (FIG. 15) is compared with a scan FF (FIG. 16), the scan FF has a more complicated structure and a larger area is accordingly required to realize the scan FF. The scan FF has drawbacks of a large chip area and a low operational speed.

Further, in the conventional structure, a large number of expectation values have to be prepared for a test. Therefore, in order to form an expectation value comparator in a LSI, a memory which stores a large number of expectation values has to be prepared inside or outside of the LSI.

Though a method of developing a test method and a test circuit for each circuit to be tested to form a BIST without scanning FFs conventionally exists, there is no adequate technique for the design of the BIST. Following are the problems of the method.

(1) Since a BIST circuit has to be designed for each circuit to be tested, it requires effort for designing.
(2) Depending on a design, a very large chip area is required.
(3) There is no guarantee that a BIST for a random logic circuit can have a high failure detection ratio.

SUMMARY OF THE INVENTION

It is an object of the invention to provide a built-in self-test circuit and a test method capable of relatively easily carrying out a self-test with a simple circuit construction on the basis of predetermined arithmetic operations by operational elements built in a semiconductor device.

According to one aspect of this invention, in a built-in self-test circuit, an operational element is allowed to perform an arithmetic operation by a test signal generated by a signal generator to obtain a signal value for comparison which is fundamentally equal to the test signal value of the signal generator, and a test result is obtained by comparing the test signal value and the signal value for comparison.

According to another aspect of the invention, a built-in self-test circuit carries out a test by applying a predetermined test signal by a signal generator to two or more operational elements. The operational elements are allowed to perform arithmetic operations to obtain a signal value for comparison which is fundamentally equal to the test signal value, and a test result is obtained by comparing the test signal value with the signal value for comparison.

Further, in the built-in self-test circuit a signal generator generates a signal having first and second signal values; an adder adds the first and second signal values generated from the signal generator; a subtracter subtracts the second signal value of the signal generator from the arithmetic operation result of the adder; and a comparator derives a test result by comparing the arithmetic operation result of the subtracter with the first signal value of the signal generator.

Further, in the built-in self-test circuit: a signal generator generates a signal having first and second signal values; a subtracter subtracts one of the first and second signal values generated from the signal generator from the other value; an adder adds the arithmetic operation result of the subtracter and the other one of the first and second signal values from the signal generator; and a comparator derives a test result by comparing the arithmetic operation result of the adder with one of the first and second signal values of the signal generator.

According to still another aspect of the invention, a built-in self-test circuit carries out a test by applying a predetermined test signal by a signal generator to the two or more operational elements. The operational elements are allowed to perform arithmetic operations to obtain an arithmetic operation result which is fundamentally equal to the test signal value, and a test result is obtained by comparing the test signal value with the arithmetic operation result.

Further, in the built-in self-test circuit: a signal generator generates a signal having a predetermined signal value; an incrementer increments the signal value generated from the signal generator; a decrementer decrements an output value of the incrementer; and a comparator derives a test result by comparing an output value of the decrementer with a signal value of the signal generator.

Further, in the built-in self-test circuit: a signal generator generates a signal having a predetermined signal value; a decrementer decrements a signal value generated from the signal generator; an incrementer increments an output value of the decrementer; and a comparator derives a test result by comparing an output value of the incrementer with a signal value of the signal generator.

According to still another aspect of the invention, a built-in self-test circuit carries out a test by applying a predetermined test signal by a signal generator to two or more operational elements. The operational elements are allowed to perform arithmetic operations to obtain an arithmetic operation result which is fundamentally equal to the test signal value, and a test result is obtained by comparing the test signal value with the arithmetic operation result.

Further, in the built-in self-test circuit: a signal generator generates a signal having first and second signal values; a multiplier multiplies the first and second signal values generated from the signal generator by each other; a divider divides the arithmetic operation result of the multiplier by one of the first and second signal values of the signal generator; and a comparator derives a test result by comparing the arithmetic operation result of the divider with the other one of the first and second signal values of the signal generator.

Further, in the built-in self-test circuit: a signal generator generates a signal having first and second signal values; a divider divides one of the first and second signal values generated from the signal generator by the other one; a multiplier multiplies the arithmetic operation result of the divider by the other one of the first and second signal values of the signal generator; and a comparator derives a test result by comparing the arithmetic operation result of the multiplier with one of the first and second signal values of the signal generator.

Further, in the built-in self-test circuit: an adder adds the same signal value as a predetermined signal value to the predetermined signal value; and an arithmetic circuit reduces an input value to the half. The adder and the arithmetic circuit are allowed to perform arithmetic operations of which result is fundamentally equal to the signal value, and a test result is obtained by comparing the arithmetic operation result with the signal value.

Further, in the built-in self-test circuit: an adder adds the same signal value as a signal value of a signal generator to the signal value; an arithmetic circuit receives the arithmetic operation result of the adder and reduces the input value to the half to obtain an arithmetic operation result fundamentally equal to the signal value of the signal generator; and a test result is obtained by comparing the arithmetic operation result of the arithmetic circuit with the signal value of the signal generator.

Further, in the built-in self-test circuit: an arithmetic circuit receives a signal from a signal generator and reducing the input value to the half; an adder adds the same signal value as an output value of the arithmetic circuit to the output value and obtains an arithmetic operation result which is fundamentally equal to the signal value of the signal generator; and a test result is obtained by comparing the arithmetic operation result of the adder with the signal value of the signal generator.

Further, in the built-in self-test circuit: a complement generator receives a signal value of the signal generator and outputs a complement on the input value; a subtracter performs subtraction between the signal value of the signal generator and the output value of the complement generator; an arithmetic circuit receives an arithmetic operation result of the subtracter and reduces the input value to the half to obtain an arithmetic operation result which is fundamentally equal to the signal value of the signal generator; and a comparator derives a test result by comparing the arithmetic operation result of the arithmetic circuit with the signal value of the signal generator.

Further, in the built-in self-test circuit comprises: a multiplier multiplies a signal value of the signal generator by a signal value "2"; an arithmetic circuit receives an arithmetic operation result of the multiplier and reduces the input value to the half to obtain an arithmetic operation result which is fundamentally equal to the signal value of the signal generator; and a comparator derives a test result by comparing the arithmetic operation result of the arithmetic circuit with the signal value of the signal generator.

Further, in the built-in self-test circuit: a divider divides a signal value of the signal generator by a signal value "½"; an arithmetic circuit receives an arithmetic operation result of the divider and reduces the input value to the half to obtain an arithmetic operation result which is fundamentally equal to the signal value of the signal generator; and a comparator obtains a test result by comparing the arithmetic operation result of the arithmetic circuit with the signal value of the signal generator.

Further, in the built-in self-test circuit: a signal generator generates a signal having first and second signal values; an adder adds the first and second signal values generated from the signal generator; a complement generator receives the second signal value of the signal generator and outputs a complement on the input value; a subtracter subtracts the output value of the complement generator from the arithmetic operation result of the adder to obtain an arithmetic operation result which is fundamentally equal to the first signal value of the signal generator; and a comparator derives a test result by comparing the arithmetic operation result of the subtracter with the first signal value of the signal generator.

According to still another aspect of the invention, a built-in self-test circuit carries out a test by applying a predetermined test signal by a signal generator to an operational element. The operational element is allowed to perform an arithmetic operation of which result is fundamentally equal to a predetermined value, and a test result is obtained by checking whether the arithmetic operation result is a predetermined value or not.

According to still another aspect of the invention, a built-in self-test circuit carries out a test by applying a predetermined test signal by a signal generator to an operational element. The operational element is allowed to perform an arithmetic operation of which result is fundamentally zero, and a test result is obtained by checking whether the arithmetic operation result is zero or not.

Further, in the built-in self-test circuit: a complement generator receives a signal value of the signal generator and outputs a complement on the input value; and an adder adds the signal value of the signal generator and an output value of the complement generator and performs an arithmetic operation of which result is fundamentally zero. In the circuit, a test result is obtained by checking whether the arithmetic operation result is zero or not.

Further, in the built-in self-test circuit: a subtracter subtracts the same signal value as a signal value of the signal generator from the signal value of the signal generator so that an arithmetic operation result is fundamentally zero. In the circuit, a test result is obtained by checking whether the arithmetic operation result is zero or not.

According to still another aspect of the invention, a built-in self-test circuit carries out a test by applying a predetermined test signal to the operational element. The operational element is allowed to perform an arithmetic operation of which result is fundamentally equal to "1", and a test result is obtained by checking whether the arithmetic operation result is "1" or not.

Further, in the built-in self-test circuit, two or more operational elements have a pipeline construction and shift registers of the number corresponding to the number of stages of the pipeline are provided.

According to still another aspect of the invention, in a test method, a test is carried out by applying a predetermined test signal generated from a signal generator which is either built in a semiconductor device or prepared outside of the semiconductor device to an operational element in the semiconductor device. Two or more operational elements are allowed to perform an arithmetic operation of which result is fundamentally equal to the test signal value, and a test result is obtained by comparing the test signal value with the arithmetic operation result.

According to still another aspect of the invention, in a test method, a test is carried out by applying a predetermined test signal generated from a signal generator which is either built in a semiconductor device or prepared outside of the semiconductor device to an operational element in the semiconductor device. An operational element is allowed to perform an arithmetic operation of which result is fundamentally equal to zero, and a test result is obtained by checking whether the arithmetic operation result is zero or not.

According to a still another aspect of the invention, in a test method, a test is carried out by applying a predetermined test signal generated from a signal generator built in a semiconductor device to an operational element of the semiconductor device. An operational element is allowed to perform an arithmetic operation of which result is fundamentally equal to "1", and a test result is obtained by checking whether the arithmetic operation result is "1" or not.

Other objects and features of this invention will become apparent from the following description with reference to the accompanying drawings.

DESCRIPTION OF THE PREFERRED EMBODIMENTS

Three embodiments of the invention will be explained hereinbelow.

Figure 1:
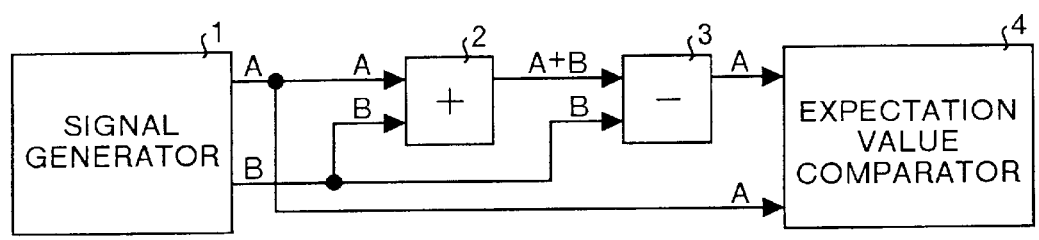
FIG. 1 is a block diagram showing a construction of a test circuit according to a first embodiment of the invention.

FIG. 1 is a circuit diagram showing a construction according to a first embodiment of the invention.

As shown in FIG. 1, a circuit comprises a signal generator 1 which takes the form of a pattern generator which generates a test signal A as an input signal to a test circuit, an adder 2 and a subtracter 3 which are objects to be tested, and an expectation value comparator 4 which compares an output of the test circuits with an input pattern.

The signal generator 1, adder 2, subtracter 3, and expectation value comparator 4 as components of a test circuit system are built in a semiconductor device such as a LSI. The signal generator 1 may be prepared outside of the semiconductor device.

The adder 2 and the subtracter 3 are constructed as functional elements in a semiconductor device such as a LSI. The adder 2 and the subtracter 3 are connected to the signal generator 1 and are tested.

The operation of the first embodiment will be described with reference to FIG. 1.

A pattern input signal value A is supplied from the signal generator 1 to one of input terminals of the adder 2 and a pattern input signal value B is supplied to the other input terminal of the adder 2.

An output value A+B is outputted from the output terminal of the adder 2 and is supplied to one of the input terminals of the subtracter 3 at the next stage.

A pattern input value B is supplied from the signal generator 1 to the other input terminal of the subtracter 3.

As a result, the value A is outputted from the output terminal of the subtracter 3.

The output signal value of the subtracter 3 is to be fundamentally equal to the test signal value A of the signal generator 1. By comparing the output with the signal value A from the signal generator 1 and confirming that the output and the signal value A are always equal to each other, a test is carried out to see whether the adder and the subtracter as components of the test circuit operate normally or not.

A circuit shown in FIG. 1 comprises: the signal generator 1 which generates the signal having first and second signal values A and B, and is built in the semiconductor device or prepared outside of the semiconductor device; the adder 2 which adds the first and second signal values A and B from the signal generator 1; the subtracter 3 which subtracts the second signal value B of the signal generator 1 from the calculation result A+B of the adder 2; and the expectation value comparator 4 which derives the test result by comparing the signal value A for comparison that is a calculation result of the subtracter 3 with the test signal value A that is the first signal value of the signal generator 1.

With the described configuration, a test can be conducted without scanning the circuit. Further, since circuits necessary for the test circuit are only the signal generator 1 and the expectation value comparator 4, the chip area can be reduced and the operational speed can be improved as compared with the case of scanning the circuit.

Furthermore, since it is sufficient to monitor whether the results always coincide with each other or not, preparation of the expectation values by a calculator for analysis of the test result is not necessary. Therefore, the efforts for the preparation are reduced, and a device which stores the expectation values becomes unnecessary.

Specifically, with a simple circuit construction and simple operation of allowing the operational elements 2 and 3 to perform an arithmetic operation on the test signal from the signal generator 1 and comparing the signal value A for comparison as a result of the arithmetic operation with the test signal value of the signal generator 1 by the expectation value comparator 4, an accurate test result can be obtained relatively easily without a special circuit construction and a special operation.

Similar effects are also obtained when two or more adders and two or more subtracters of the embodiment are provided, that is, when the number of adders and subtracters is increased to (n).

Even if the order of the adder 2 and the subtracter 3 shown in FIG. 1 is reversed, similar effects are obtained.

According to this construction, a circuit comprises: a signal generator 1 which generates a signal having first and second signal values A and B and is built in a semiconductor device or prepared outside of the semiconductor device; a subtracter 3 which subtracts one A of the first and second signal values A and B generated by the signal generator 1 from the other B; an adder 2 which adds the result A−B of the calculation of the subtracter 3 and other signal value B of the first and second signal values from the signal generator 1; and an expectation value comparator 4 which derives the test result by comparing a signal value A for comparison that is a calculation result of the adder 2 with the test signal value A that is one of the first and second signal values of the signal generator 1.

Figure 2:
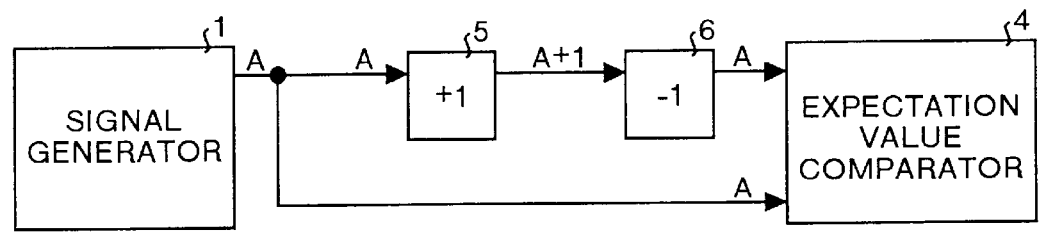
FIG. 2 is a block diagram showing a construction of the test circuit according to the first embodiment of the invention.

Similar effects are also obtained by replacing the adder 2 and the subtracter 3 of the test circuit shown in FIG. 1 with an incrementer 5 and a decrementer 6 as shown in FIG. 2.

According to this construction, a circuit comprises: the signal generator 1 which generates a predetermined signal value A, and is either built in a semiconductor device or prepared outside of the semiconductor device; the incrementer 5 which increments the signal value A from the signal generator 1; the decrementer 6 which decrements an output value A+1 of the incrementer 5; and the expectation value comparator 4 which derives the test result by comparing the signal value for comparison that is an output value of the decrementer 6 with the test signal value A that is a signal value of the signal generator.

Similar effects are obtained when the incrementer 5 and the decrementer 6 shown in FIG. 2 are arranged in the reverse order.

According to this construction, a circuit comprises: the signal generator 1 which generates a predetermined signal value A, and is either built in a semiconductor device or prepared outside of the semiconductor device; the decrementer 6 which decrements the signal value A from the signal generator 1; the incrementer 5 which increments the output value A−1 of the decrementer 6; and the expectation value comparator 4 which derives the test result by comparing the signal value A for comparison that is an output value of the incrementer 5 with the test signal value A that is a signal value of the signal generator 1.

Figure 3:
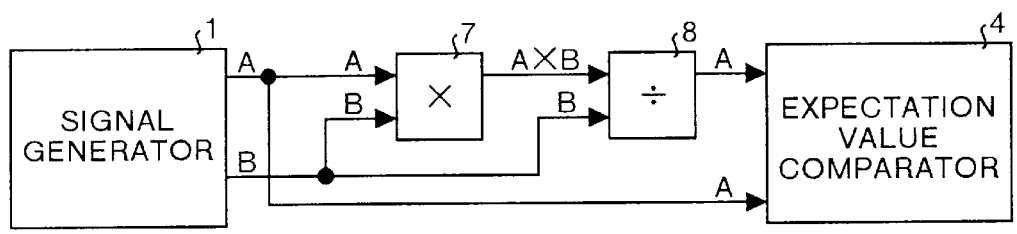
FIG. 3 is a block diagram showing a construction of the test circuit according to the first embodiment of the invention.

Further, also by replacing the adder 2 and the subtracter 3 of the test circuit shown in FIG. 1 with a multiplier 7 and a divider 8 as shown in FIG. 3, similar effects are obtained.

According to this construction, as shown in FIG. 3, a circuit comprises: the signal generator 1 which generates a signal having first and second signal values A and B, and is either built in a semiconductor device or prepared outside of the semiconductor device; the multiplier 7 which multiplies the first and second signal values A and B from the signal generator 1 by each other; the divider 8 which divides the arithmetic operation result A×B of the multiplier 7 by the other one B of the first and second signal values of the signal generator 1; and the expectation value comparator 4 which derives the test result by comparing the signal value A for comparison that is an arithmetic operation result of the divider 8 with the test signal value A that is one of the first and second signal values of the signal generator 1.

When the multiplier 7 and the divider 8 shown in FIG. 3 are arranged in the reverse order, similar effects are also obtained.

According to this construction, a circuit comprises: the signal generator 1 which generates a signal having first and second signal values A and B, and is either built in a semiconductor device or prepared outside of the semiconductor device; the divider 8 which divides one A of the first and second signal values A and B generated from the signal generator 1 by the other signal value B; the multiplier 7 which multiplies the arithmetic operation result A/B of the divider 8 by the other one B of the first and second signal values of the signal generator 1; and the expectation value comparator 4 which derives the test result by comparing the signal value A for comparison that is an arithmetic operation result of the multiplier 7 with the test signal value A that is one of the first and second signal values of the signal generator 1.

Figure 4:
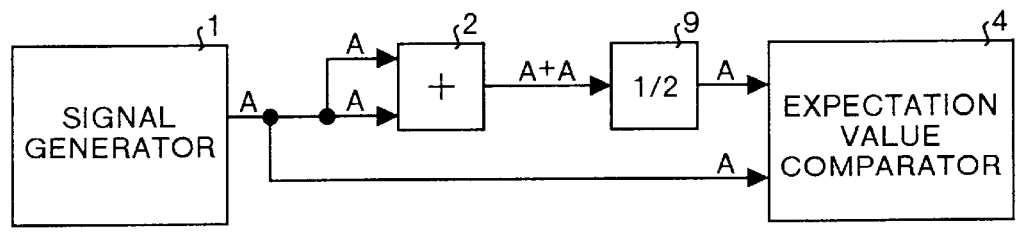
FIG. 4 is a block diagram showing a construction of the test circuit according to the first embodiment of the invention.

Similar effects are also obtained by combining the adder and an arithmetic circuit which reduces an input value to the half as shown in FIG. 4.

According to this construction, as shown in FIG. 4, a circuit comprises: the adder 2 which adds the same signal value as the signal value A of the signal generator 1 to the signal value A of the signal generator 1 either built in a semiconductor device or prepared outside of the semiconductor device; the arithmetic circuit 9 which receives the arithmetic operation result A+A of the adder 2 and reduces the input value to the half to obtain an arithmetic operation result which is fundamentally equal to the signal value A of the signal generator 1; and the expectation value comparator 4 which derives the test result by comparing the comparison signal value A that is an arithmetic operation result of the arithmetic circuit 9 with the test signal value A that is a signal value of the signal generator 1.

Similar effects are also obtained by arranging the adder 2 and the arithmetic circuit 9 which reduces the input value to the half the reverse inverse order as shown in FIG. 4.

According to this construction, a circuit comprises: the arithmetic circuit 9 which receives the signal A from the signal generator 1 either built in the semiconductor device or prepared on the outside of the semiconductor device and reduces the input value to the half; the adder 2 which adds the output value A/2 of the arithmetic circuit 9 and the same signal value A/2 as the output value A/2 to obtain an arithmetic operation result which is fundamentally equal to the signal value A of the signal generator 1; and the expectation value comparator 4 which derives the test result by comparing the comparison signal value A that is an arithmetic operation result of the adder 2 with the test signal value A that is a signal value of the signal generator 1.

Figure 6:
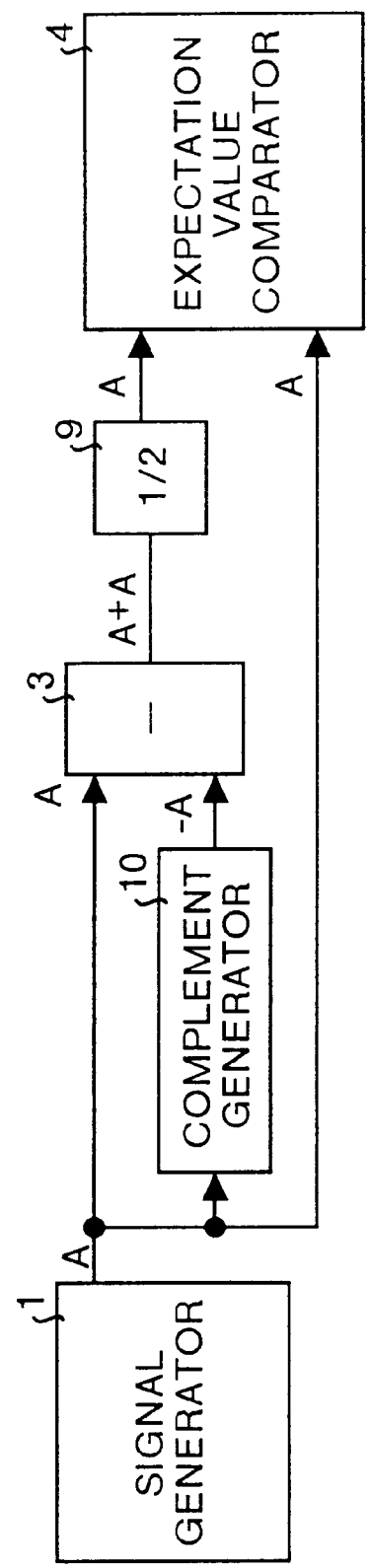
FIG. 6 is a block diagram showing a construction of the test circuit according to the first embodiment of the invention.

Further, similar effects are obtained also by a construction in which the subtracter, a complement generator, and the arithmetic circuit which reduces the input value to the half are connected as shown in FIG. 6.

According to this construction, as shown in FIG. 6, a circuit comprises: a complement generator 10 which receives a signal value A of the signal generator 1 which is either built in a semiconductor device or prepared outside of the semiconductor device and outputs a complement −A on the input value; the subtracter 3 which subtracts the output value −A of the complement generator 10 from the signal value A of the signal generator 1; the arithmetic circuit 9 which receives the arithmetic operation result A+A of the subtracter 3 and reduces an input value to the half to obtain the arithmetic operation result A which is fundamentally equal to the signal value A of the signal generator 1; and the expectation value comparator 4 which derives the test result by comparing the comparison signal value A that is an arithmetic operation result of the arithmetic circuit 9 with the test signal value A that is the signal value of the signal generator 1.

Figure 8:
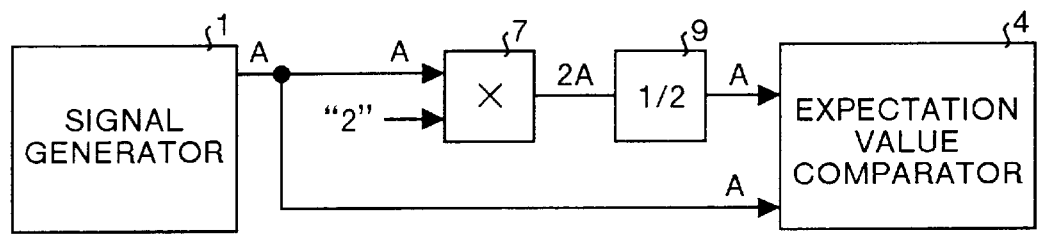
FIG. 8 is a block diagram showing a construction of the test circuit according to the first embodiment of the invention.

Further, by a construction of combining the multiplier and the arithmetic circuit which reduces the input value to the half and connecting them as shown in FIG. 8, similar effects are also obtained.

According to this construction, as shown in FIG. 8, a circuit comprises: the multiplier 7 which multiplies the signal value of the signal generator 1 either built in a semiconductor device or prepared outside of the semiconductor device by a signal value "2"; the arithmetic circuit 9 which receives an arithmetic operation result 2A of the multiplier 7 and reduces the input value to the half to obtain an arithmetic operation result which is fundamentally equal to the signal value A of the signal generator 1; and the expectation value comparator 4 which derives the test result by comparing the signal value A for comparison that is an arithmetic calculation result of the arithmetic circuit 9 with the test signal value A that is a signal value of the signal generator 1.

Figure 9:
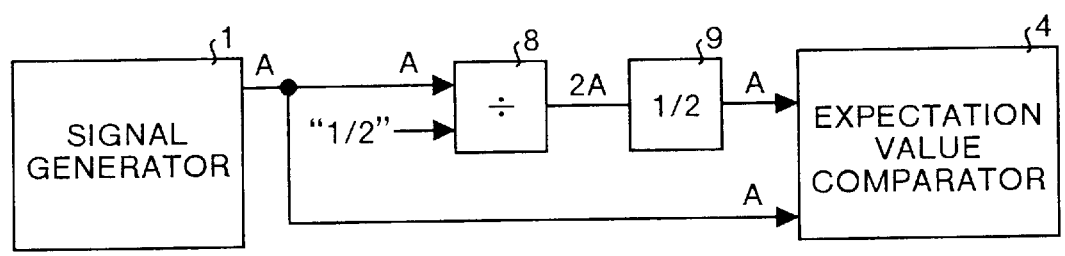
FIG. 9 is a block diagram showing a construction of the test circuit according to the first embodiment of the invention.

Further, similar effects are obtained by a construction in which the divider and the arithmetic circuit which reduces the input value to the half are combined and connected as shown in FIG. 9.

According to this construction, as shown in FIG. 9, a circuit comprises: the divider 8 which divides the signal value A of the signal generator 1 built in a semiconductor device or prepared outside of the semiconductor device by a signal value "½"; the arithmetic circuit 9 which receives an arithmetic operation result 2A of the divider 8 and reduces the input value to the half to obtain an arithmetic operation result A which is fundamentally equal to a signal value A of the signal generator 1; and the expectation value comparator 4 which derives the test result by comparing the signal value A for comparison that is an arithmetic operation result of the arithmetic circuit 9 with the test signal value A that is a signal value of the signal generator 1, thereby deriving a test result.

Figure 10:
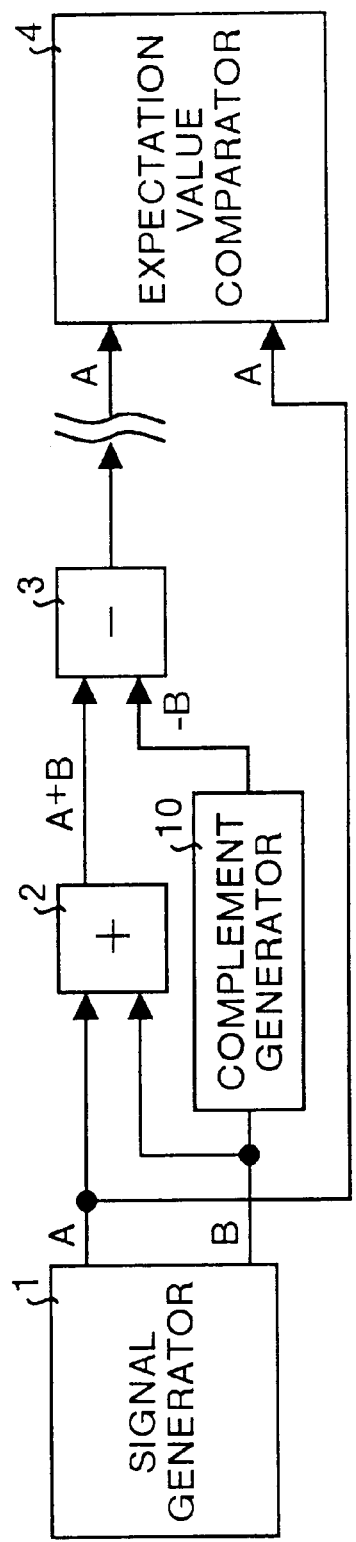
FIG. 10 is a block diagram showing a construction of the test circuit according to the first embodiment of the invention.

Generally, similar effects are also obtained by a construction in which a circuit which outputs a value equal to an input value by combining arbitrary arithmetic units is connected to the comparator as shown in FIG. 10.

According to this construction, as shown in FIG. 10, a circuit comprises: the signal generator 1 which generates a signal having first and second signal values A and B, which is either built in a semiconductor device or prepared outside of the semiconductor device; the adder 2 which adds the first and second signals A and B from the signal generator 1; the complement generator 10 which receives the second signal value B of the signal generator 1 and outputs the complement −B on the input value; the subtracter 3 which subtracts the output value B of the complement generator 10 from the arithmetic operation result A+B of the adder 1 to obtain the arithmetic operation result A which is fundamentally equal to the first signal value A of the signal generator 1; and the expectation value comparator 4 which derives the test result by comparing the signal value A for comparison that is an arithmetic operation result of the subtracter 3 with the test signal value A that is the first signal value of the signal generator 1.

Figure 5:
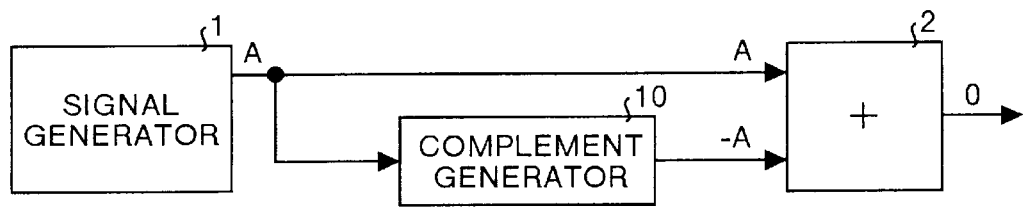
FIG. 5 is a block diagram showing a construction of a test circuit according to a second embodiment of the invention.

FIG. 5 is a circuit diagram showing a construction according to a second embodiment of the invention.

In the drawing, a circuit comprises: the signal generator 1 which takes the form of a pattern generator which generates the test signal A as an input signal to a test circuit; the adder 2 which is a component of the test circuit and is an object to be tested; the complement generator 10 which outputs the complement on the input value; and the expectation value comparator 4 which compares an output from the test circuit with an input pattern.

The signal generator 1, adder 2, complement generator 10 and expectation value comparator 4 are built in a semiconductor device such as an LSI as components of a test circuit system. The signal generator 1 may be prepared outside of the semiconductor device.

The adder 2 is constructed as a functional element in a semiconductor device such as a LSI and connected to the signal generator 1. The adder 2 is an object to be tested.

The operation of the second embodiment will now be described.

A pattern is generated from the signal generator 1. An input pattern A and a complement −A on the input pattern A are supplied to terminals of the adder 2, so that an output of zero is always outputted from the adder 2.

A test is carried out to see whether or not the adder as a component of the test circuit operates normal by checking that the value outputted is always zero.

According to the construction, as shown in FIG. 5, a circuit comprises: the complement generator 10 which receives a signal value A of the signal generator 1 which is either built in a semiconductor device or prepared outside of the semiconductor device and outputs the complement −A on the input value; and the adder 2 which adds the signal value A of the signal generator 1 and the output value −A of the complement generator 10 to derive the arithmetic operation result which is fundamentally zero. By checking whether the calculation result is zero or not, the test result is obtained.

With the construction, also in the case where the circuit has therein only the adder, a test can be conducted without scanning the circuit. Further, since circuits necessary for a test circuit are only the signal generator and the complement generator, the chip area can be reduced more and the operation speed can be increased as compared with the case of scanning the circuit.

Furthermore, since it is sufficient to monitor whether the value outputted is always zero or not, preparation of expectation values by a computer for the analysis of the test result is not required. Therefore, the efforts are accordingly reduced and an advantage such that a device which stores the expectation values becomes unnecessary.

Specifically, with the simple circuit construction and simple operation of allowing the operational element 2 to perform an arithmetic operation of which result becomes fundamentally zero by the test signal of the signal generator 1 and checking whether the arithmetic operation result is zero or not, an accurate test result can be obtained relatively easily without needing a special circuit construction and a special operation.

Figure 7:
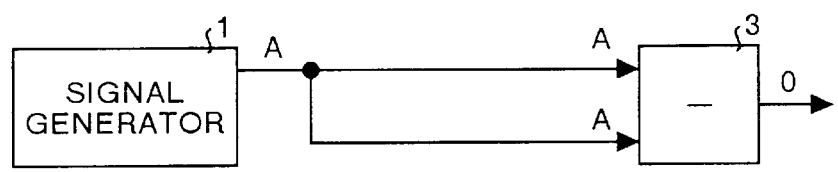
FIG. 7 is a block diagram showing a construction of a test circuit according to the second embodiment of the invention.

Similar effects are also obtained by the construction of FIG. 7 in which the adder in the test circuit shown in FIG. 5 is replaced with the subtracter, and the complement generator is removed.

According to this construction, as shown in FIG. 7, a circuit comprises the subtracter 3 which executes subtraction between the signal value A of the signal generator 1 which is either built in a semiconductor device or prepared outside of the semiconductor device and the same signal value A so that the arithmetic operation result is fundamentally equal to zero. By checking whether the arithmetic operation result is zero or not, the test result is derived.

In the second embodiment according to the invention, as described above, the operational elements such as the adder 2, subtracter 3, and the like are allowed to perform an arithmetic operation of which result is inherently equal to zero, and a test result is obtained by checking whether the arithmetic operation result is zero. Similar effects are also obtained by allowing an arithmetic operation whose result becomes a predetermined value such as 1 which is easily determined to be performed, and deriving a test result by checking whether the arithmetic operation result is 1 or not.

The construction comprises operational elements such as the adder 2 and the subtracter 3 to be tested. A test is carried out by applying a predetermined test signal to the operational elements. In the circuit, the operational elements are allowed to execute the arithmetic operation of which result is fundamentally equal to a predetermined value such as 1, and a test result is obtained by checking whether the arithmetic operation result is the predetermined value such as 1.

Figure 11:
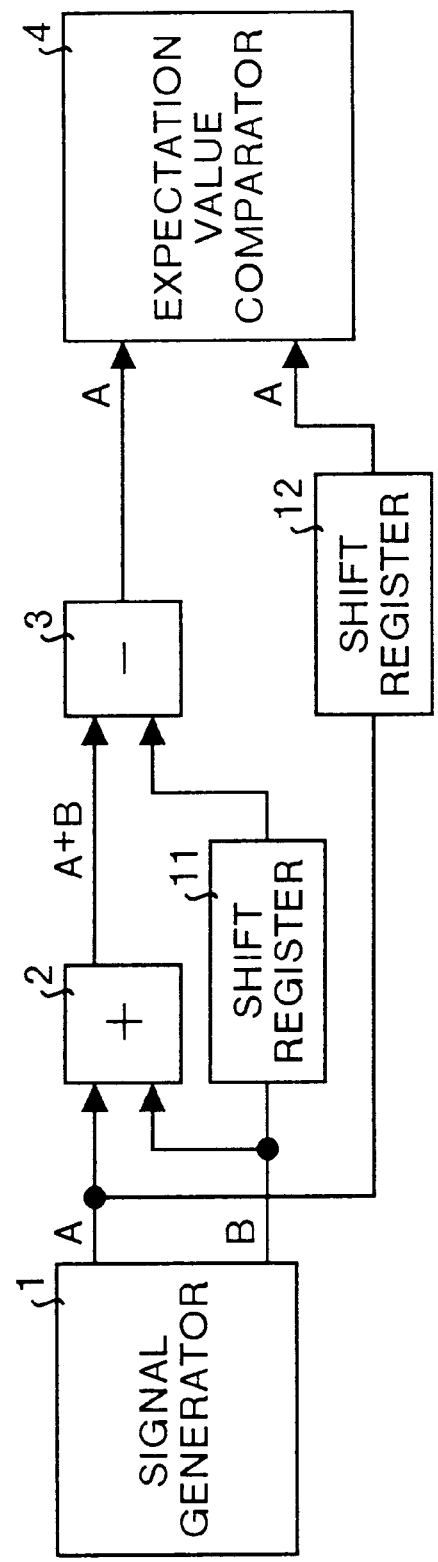
FIG. 11 is a block diagram showing a construction of a test circuit according to a third embodiment of the invention.
Figure 12:
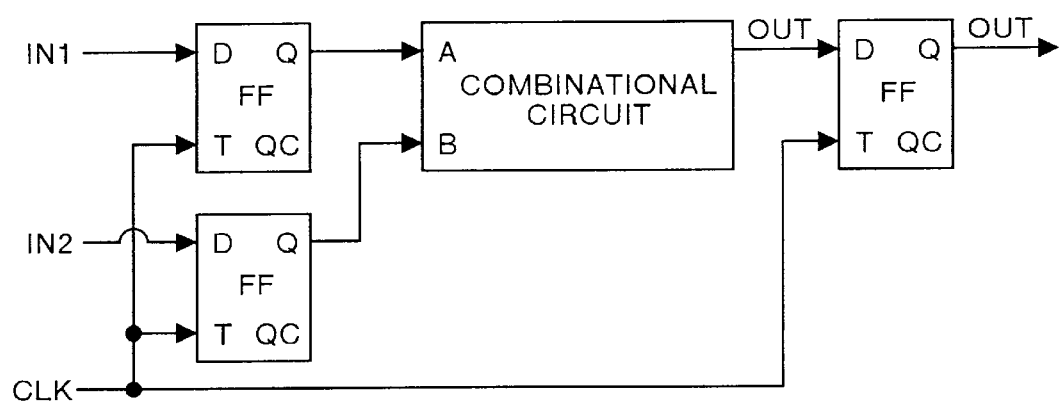
FIG. 12 is a block diagram showing the circuit construction according to a conventional technique.
Figure 13:
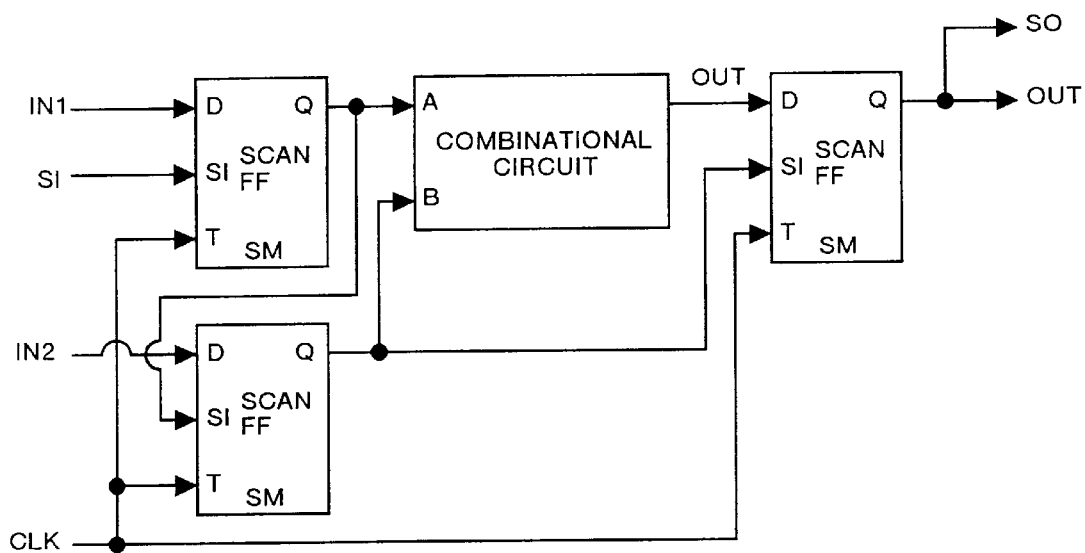
FIG. 13 is a block diagram showing a construction of a full scan circuit according to a conventional technique.
Figure 14:
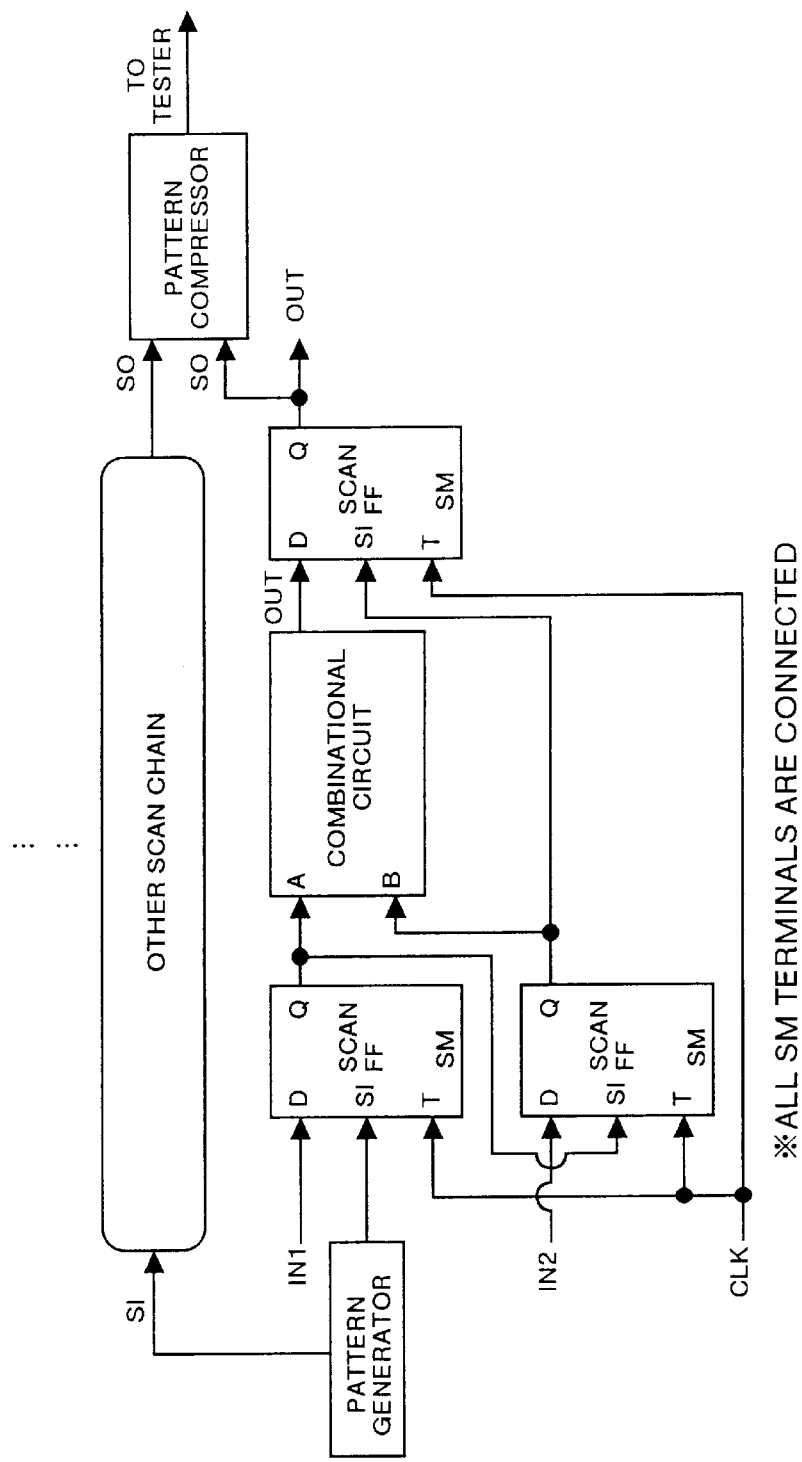
FIG. 14 is a block diagram showing a construction of the full scan circuit according to a conventional technique.
Figure 15:
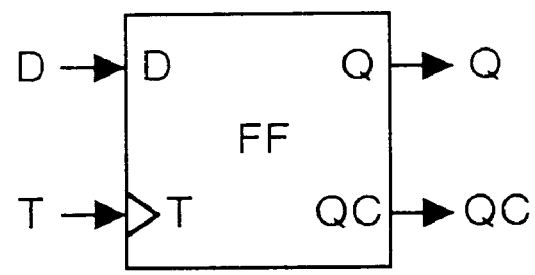
FIG. 15 is a block diagram showing the construction of a FF according to a conventional technique.
Figure 16:
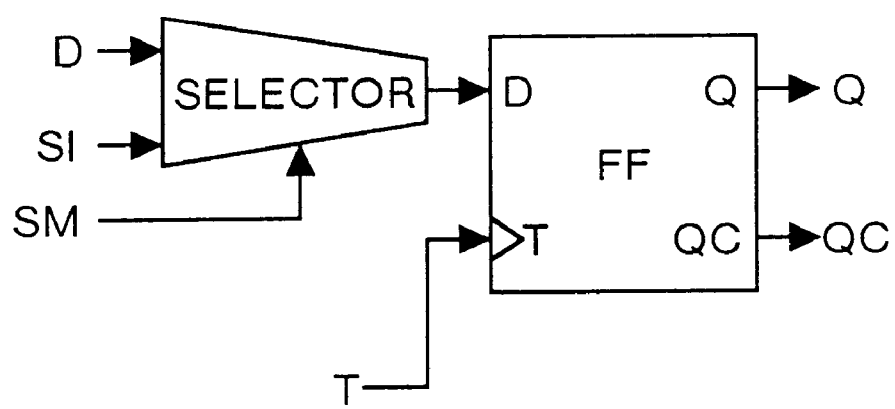
FIG. 16 is a block diagram showing the construction of a scan FF according to the conventional technique.

FIG. 11 is a circuit diagram showing the construction according to a third embodiment of the invention.

According to the construction shown in FIG. 5, a circuit comprises: the signal generator 1 which generates a pattern supplied to a test circuit; the adder 2 and the subtracter 3 (each has a pipeline structure) as components of the test circuit; the comparator 4 which compares an output of the test circuit with the input pattern; shift registers 11 of the number corresponding to the number of stages of the pipeline of the adder 2; and shift registers 12 of the number corresponding to the sum of the numbers of pipelines of the adder 2 and that of the subtracter 3.

The signal generator 1, adder 2, subtracter 3, expectation value comparator 4, and shift registers 11 and 12 are built in a semiconductor device such as an LSI as components of a test circuit system. The signal generator 1 may be prepared outside of the semiconductor device.

The operation of the third embodiment will now be described.

Patterns A and B are supplied from the signal generator 1 to input terminals of the adder 2. A value A+B is outputted from the adder 2.

The output is then supplied to the subtracter 3. At the same time, the pattern B delayed by an amount corresponding to the number of stages of the pipeline of the adder 2 by the shift register 11 is supplied to the subtracter 3, and the value A is outputted from the subtracter 3.

The output is compared with the output A which is generated by the signal generator 1 and delayed by the amount corresponding to the number of stages of the pipeline of the adder 2 and the subtracter 3 by the shift register 12. By checking whether or not the outputs coincide with each other, a test to see whether the adder 2 and the subtracter 3 as components of the test circuit operate normal is carried out.

With the construction, even when the adder and subtracter have the pipeline construction, effects similar to those of the first embodiment are obtained.

Effects similar to those of the first and second embodiments are also obtained when each of the operational elements has a pipeline structure in each of the circuits according to the first and second embodiments.

As described above, according to the embodiments of the invention, by forming the BIST circuit by limiting the circuits to be tested to arithmetic units (adder, subtracter, multiplier, divider, incrementer, decrementer, and the like), a test can be carried out without fully scanning the circuit.

By preparing only the expectation value comparator, the circuit which reduces an input to the half, and the pattern generator, the BIST circuit formed according to the invention can be formed by just connecting the elements. It is necessary to add only the complement generator, the circuit which reduces an input to the half, and the expectation value comparator to the BIST circuit formed by fully scanning the above elements. Since they can be realized in a small-scaled circuit, there are the following advantages.

(1) Efforts of designing can be reduced.
(2) Increase in chip area can be suppressed.
(3) Reduction in operational speed can be suppressed.
(4) Since the expectation value is generated within the circuit, an element such as a memory which stores the expectation value is unnecessary.

Each of the components in the embodiments of the invention can be realized by a specific construction as follows.

(1) The complement generator 10 can be realized by a circuit obtained by preparing inverters (each of which is an element which inverts an input and is usually made by two MOS transistors) of the number equal to the number of bits.
(2) The arithmetic circuit 9 which reduces an input value to the half is realized by an arithmetic circuit which shifts an input to a lower-order position by one bit.
(3) The expectation value comparator 4 is realized by a circuit in which exclusive OR (XOR) gates of the number equal to the number of bits are prepared.

According to one aspect of this invention, the built-in self-test circuit comprises: the signal generator which is either built in a semiconductor device or prepared outside of the semiconductor device; and the operational element to be tested in the semiconductor device. In the circuit, the operational element is allowed to perform an arithmetic operation by a test signal generated by the signal generator to obtain a signal value for comparison which is fundamentally equal to the test signal value of the signal generator, and a test result is obtained by comparing the test signal value and the signal value for comparison. Therefore, the built-in self-test circuit capable of relatively easily carrying out a self test with a simple circuit construction on the basis of a predetermined arithmetic operation performed by the operational element built in the semiconductor device can be obtained.

According to another aspect of the invention, the built-in self-test circuit comprises: the signal generator which is either built in a semiconductor device or prepared outside of the semiconductor device; and two or more operational elements including an adder and a subtracter to be tested in the semiconductor device, and carries out a test by applying a predetermined test signal to the operational elements. In the circuit, the operational elements are allowed to perform arithmetic operations to obtain a signal value for comparison which is fundamentally equal to the test signal value, and a test result is obtained by comparing the test signal value with the signal value for comparison. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having first and second signal values; the adder which adds the first and second signal values generated from the signal generator; the subtracter which subtracts the second signal value of the signal generator from the arithmetic operation result of the adder; and the comparator which derives a test result by comparing the arithmetic operation result of the subtracter with the first signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having first and second signal values; the subtracter which subtracts one of the first and second signal values generated from the signal generator from the other value; the adder which adds the arithmetic operation result of the subtracter and the other one of the first and second signal values from the signal generator; and the comparator which derives a test result by comparing the arithmetic operation result of the adder with one of the first and second signal values of the signal generator. Therefore, the built-in self-test circuit capable of relatively easily carrying out a self test with a simple circuit construction on the basis of a predetermined arithmetic operation performed by the operational elements built in the semiconductor device can be obtained.

According to still another aspect of the invention, the built-in self-test circuit comprises: the signal generator which is either built in a semiconductor device or prepared outside of the semiconductor device; and two or more operational elements including an incrementer and a decrementer to be tested in the semiconductor device, and carries out a test by applying a predetermined test signal to the operational elements. In the circuit, the operational elements are allowed to perform arithmetic operations to obtain an arithmetic operation result which is fundamentally equal to the test signal value, and a test result is obtained by comparing the test signal value with the arithmetic operation result. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having a predetermined signal value; the incrementer which increments the signal value generated from the signal generator; the decrementer which decrements an output value of the incrementer; and the comparator which derives a test result by comparing an output value of the decrementer with a signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having a predetermined signal value; the decrementer which decrements a signal value generated from the signal generator; the incrementer which increments an output value of the decrementer; and the comparator which derives a test result by comparing an output value of the incrementer with a signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

According to still another aspect of the invention, the built-in self-test circuit comprises: the signal generator which is either built in a semiconductor device or prepared outside of the semiconductor device; and two or more operational elements including a multiplier and a divider in the semiconductor device, and carries out a test by applying a predetermined test signal to the operational elements. In the circuit, the operational elements are allowed to perform arithmetic operations to obtain an arithmetic operation result which is fundamentally equal to the test signal value, and a test result is obtained by comparing the test signal value with the arithmetic operation result. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having first and second signal values; the multiplier which multiplies the first and second signal values generated from the signal generator by each other; the divider which divides the arithmetic operation result of the multiplier by one of the first and second signal values of the signal generator; and the comparator which derives a test result by comparing the arithmetic operation result of the divider with the other one of the first and second signal values of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having first and second signal values; the divider which divides one of the first and second signal values generated from the signal generator by the other one; the multiplier which multiplies the arithmetic operation result of the divider by the other one of the first and second signal values of the signal generator; and the comparator which derives a test result by comparing the arithmetic operation result of the multiplier with one of the first and second signal values of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the adder which adds the same signal value as a predetermined signal value to the predetermined signal value; and the arithmetic circuit which reduces an input value to the half. In the circuit, the adder and the arithmetic circuit are allowed to perform arithmetic operations of which result is fundamentally equal to the signal value, and the test result is obtained by comparing the arithmetic operation result with the signal value. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the adder which adds the same signal value as a signal value of a signal generator to the signal value; the arithmetic circuit which receives the arithmetic operation result of the adder and reduces the input value to the half to obtain an arithmetic operation result fundamentally equal to the signal value of the signal generator; and a test result is obtained by comparing the arithmetic operation result of the arithmetic circuit with the signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the arithmetic circuit which receives a signal from a signal generator and reducing the input value to the half; the adder which adds the same signal value as an output value of the arithmetic circuit to the output value and obtains an arithmetic operation result which is fundamentally equal to the signal value of the signal generator; and a test result is obtained by comparing the arithmetic operation result of the adder with the signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the complement generator which receives a signal value of the signal generator and outputs a complement on the input value; the subtracter which performs subtraction between the signal value of the signal generator and the output value of the complement generator; the arithmetic circuit which receives an arithmetic operation result of the subtracter and reduces the input value to the half to obtain an arithmetic operation result which is fundamentally equal to the signal value of the signal generator; and the comparator which derives a test result by comparing the arithmetic operation result of the arithmetic circuit with the signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the multiplier which multiplies a signal value of the signal generator by a signal value "2"; the arithmetic circuit which receives an arithmetic operation result of the multiplier and reduces the input value to the half to obtain an arithmetic operation result which is fundamentally equal to the signal value of the signal generator; and the comparator which derives a test result by comparing the arithmetic operation result of the arithmetic circuit with the signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the divider which divides a signal value of the signal generator by a signal value "½"; the arithmetic circuit which receives an arithmetic operation result of the divider and reduces the input value to the half to obtain an arithmetic operation result which is fundamentally equal to the signal value of the signal generator; and the comparator which derives a test result by comparing the arithmetic operation result of the arithmetic circuit with the signal value of the signal generator. Therefore, the built-in self-test circuit capable of relatively easily carrying out a self test with a simple circuit construction on the basis of a predetermined arithmetic operation performed by the operational elements built in the semiconductor device can be obtained.

Further, the built-in self-test circuit comprises: the signal generator which generates a signal having first and second signal values; the adder which adds the first and second signal values generated from the signal generator; the complement generator which receives the second signal value of the signal generator and outputs a complement on the input value; the subtracter which subtracts the output value of the complement generator from the arithmetic operation result of the adder to obtain an arithmetic operation result which is fundamentally equal to the first signal value of the signal generator; and the comparator which derives a test result by comparing the arithmetic operation result of the subtracter with the first signal value of the signal generator. Consequently, the built-in self-test circuit capable of relatively easily carrying out a self test with a simple circuit construction on the basis of a predetermined arithmetic operation performed by the operational elements built in the semiconductor device can be obtained.

According to still another aspect of the invention, the built-in self-test circuit comprises: the signal generator which is either built in a semiconductor device or prepared outside of the semiconductor device; and the operational element to be tested in the semiconductor device, and carries out a test by applying a predetermined test signal to the operational element. In the circuit, the operational element is allowed to perform an arithmetic operation of which result is fundamentally equal to a predetermined value, and a test result is obtained by checking whether the arithmetic operation result is a predetermined value or not. Therefore, the built-in self-test circuit capable of relatively easily carrying out a self test with a simple circuit construction on the basis of a predetermined arithmetic operation performed by the operational element built in the semiconductor device can be obtained.

According to still another aspect of the invention, the built-in self-test circuit comprises: the signal generator which is either built in a semiconductor device or prepared outside of the semiconductor device; and the operational element to be tested in the semiconductor device, and carries out a test by applying a predetermined test signal to the operational element. In the circuit, the operational element is allowed to perform an arithmetic operation of which result is fundamentally zero, and a test result is obtained by checking whether the arithmetic operation result is zero or not. Therefore, the built-in self-test circuit capable of relatively easily carrying out a self test with a simple circuit construction on the basis of a predetermined arithmetic operation performed by the operational element built in the semiconductor device can be obtained.

Further, the built-in self-test circuit comprises: the complement generator which receives a signal value of the signal generator and outputs a complement on the input value; and the adder which adds the signal value of the signal generator and an output value of the complement generator and performs an arithmetic operation of which result is fundamentally zero. In the circuit, a test result is obtained by checking whether the arithmetic operation result is zero or not. Therefore, the built-in self-test circuit capable of relatively easily carrying out a self test with a simple circuit construction on the basis of a predetermined arithmetic operation performed by the operational element built in the semiconductor device can be obtained.

Further, the built-in self-test circuit comprises: the subtracter which subtracts the same signal value as a signal value of the signal generator from the signal value of the signal generator so that an arithmetic operation result is fundamentally zero. In the circuit, a test result is obtained by checking whether the arithmetic operation result is zero or not. Therefore, the built-in self-test circuit capable of relatively easily carrying out a self test with a simple circuit construction on the basis of a predetermined arithmetic operation performed by the operational element built in the semiconductor device can be obtained.

According to still another aspect of the invention, the built-in self-test circuit comprises the operational element to be tested and carries out a test by applying a predetermined test signal to the operational element. In the circuit, the operational element is allowed to perform an arithmetic operation of which result is fundamentally equal to "1", and a test result is obtained by checking whether the arithmetic operation result is "1" or not. Therefore, the built-in self-test circuit capable of relatively easily carrying out a self test with a simple circuit construction on the basis of a predetermined arithmetic operation performed by the operational element built in the semiconductor device can be obtained.

Further, in the built-in self-test circuit, two or more operational elements have a pipeline construction and shift registers of the number corresponding to the number of stages of the pipeline are provided. Therefore, also in the case of adopting the pipeline construction, the built-in self-test circuit capable of relatively easily carrying out a self test with a simple circuit construction on the basis of a predetermined arithmetic operation performed by the operational elements built in the semiconductor device can be obtained.

According to still another aspect of the invention, there is provided the test method which carries out a test by applying a predetermined test signal generated from a signal generator which is either built in a semiconductor device or prepared outside of the semiconductor device to an operational element in the semiconductor device. Two or more operational elements are allowed to perform an arithmetic operation of which result is fundamentally equal to the test signal value, and a test result is obtained by comparing the test signal value with the arithmetic operation result. Therefore, the test method using the built-in self-test circuit capable of relatively easily carrying out a self test with a simple circuit construction on the basis of a predetermined arithmetic operation performed by the operational elements built in the semiconductor device can be achieved.

According to still another aspect of the invention, there is provided a test method which carries out a test by applying a predetermined test signal generated from a signal generator which is either built in a semiconductor device or prepared outside of the semiconductor device to an operational element in the semiconductor device. The operational element is allowed to perform an arithmetic operation of which result is fundamentally equal to zero, and a test result is obtained by checking whether the arithmetic operation result is zero or not. Therefore, the test method using the built-in self-test circuit capable of relatively easily carrying out a self test with a simple circuit construction on the basis of a predetermined arithmetic operation performed by the operational element built in the semiconductor device can be achieved.

According to still another aspect of the invention, there is provided a test method which carries out a test by applying a predetermined test signal generated from a signal generator built in a semiconductor device to an operational element of the semiconductor device. The operational element is allowed to perform an arithmetic operation of which result is fundamentally equal to "1", and a test result is obtained by checking whether the arithmetic operation result is "1" or not. Therefore, the test method using the built-in self-test circuit capable of relatively easily carrying out a self test with a simple circuit construction on the basis of a predetermined arithmetic operation performed by the operational element built in the semiconductor device can be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor apparatus comprising:
    an arithmetic circuit including a plurality of operational elements, receiving a test signal having a test signal value, and outputting, in response to the test signal, an output signal having an output signal value, wherein
        the plurality of operational elements are connected to perform arithmetic operations on the test signal value that result in a result value equal to the test signal value, and
        the result value is output as the output signal value; and
    a comparator comparing the test signal to the output signal, wherein, when the arithmetic circuit is tested using the test signal and, if the operational elements are not defective, the output signal is equivalent to the test signal.

2. The semiconductor apparatus according to claim 1, wherein
    one of the plurality of operational elements is an adder, and
    one of the plurality of operational elements is a subtracter.

3. The semiconductor apparatus according to claim 1, wherein
    one of the plurality of operational elements is an incrementer, and
    one of the plurality of operational elements is a decrementer.

4. The semiconductor apparatus according to claim 1, wherein
    one of the plurality of operational elements is a multiplier, and
    one of the plurality of operational elements is a divider.

5. The semiconductor apparatus according to claim 1, wherein
one of the plurality of operational elements is an adder, and
one of the plurality of operational elements is an arithmetic element that reduces a value represented by a signal that the arithmetic element receives to half.

6. The semiconductor apparatus according to claim 1, wherein
one of the plurality of operational elements is a complement generator that outputs a signal representing a complement of a value represented by a signal that the complement generator receives,
one of the plurality of operational elements is a subtracter, and
one of the plurality of operational elements is an arithmetic element that reduces a value represented by a signal that the arithmetic element receives to half.

7. The semiconductor apparatus according to claim 1, wherein
one of the plurality of operational elements is a multiplier that multiplies a value represented by a signal the multiplier receives by a value of two, and
one of the plurality of operational elements is an arithmetic element that reduces a value represented by a signal the arithmetic element receives to half.

8. The semiconductor apparatus according to claim 1, wherein
one of the plurality of operational elements is a divider that divides a value represented by a signal the divider receives by a value of one half, and
one of the plurality of operational elements is an arithmetic element that reduces a value represented by a signal the arithmetic element receives to half.

9. The semiconductor apparatus according to claim 1, wherein
one of the plurality of operational elements is an adder,
one of the plurality of operational elements is a subtracter, and
one of the plurality of operational elements is a complement generator that outputs a signal representing a complement of a value represented by a signal that the complement generator receives.

10. The semiconductor apparatus according to claim 1, wherein
one of the plurality of operational elements is an adder,
one of the plurality of operational elements is a subtracter,
one of the plurality of operational elements is a first shift register, and
one of the plurality of operational element is a second shift register.

11. A semiconductor apparatus comprising an arithmetic circuit including at least one operational element, receiving a test signal having a test signal value, and outputting, in response to the test signal, an output signal having an output signal value, wherein
the at least one operational element performs arithmetic operations on the test signal value that result in a result value equal to zero, the result value being output as the output signal value, and,
when the arithmetic circuit is tested using the test signal, if the arithmetic circuit is not defective, the arithmetic circuit outputs, as the output signal, an output signal value of zero.

12. The semiconductor apparatus according to claim 11, wherein at least one operational element includes
a complement generator that outputs a signal representing a complement of a value represented by a signal that the complement generator receives, and
an adder.

13. The semiconductor apparatus according to claim 11, wherein the at least one operational element is a subtracter.

* * * * *